(12) United States Patent
Lisbona

(10) Patent No.: US 9,513,024 B2
(45) Date of Patent: *Dec. 6, 2016

(54) DEVICE EMPLOYABLE IN DIFFERENT CIRCUIT CONFIGURATIONS USING PARALLEL WIRING HARNESSES, A HVAC SYSTEM EMPLOYING THE DEVICE AND A METHOD OF MANUFACTURING A HVAC UNIT

(71) Applicant: Lennox Industries Inc., Richardson, TX (US)

(72) Inventor: Randall L. Lisbona, Coppell, TX (US)

(73) Assignee: Lennox Industries Inc., Richardson, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/050,738

(22) Filed: Feb. 23, 2016

(65) Prior Publication Data

US 2016/0169548 A1    Jun. 16, 2016

Related U.S. Application Data

(60) Continuation of application No. 14/840,398, filed on Aug. 31, 2015, now Pat. No. 9,297,549, which is a (Continued)

(51) Int. Cl.
*H01R 3/00* (2006.01)
*F24F 11/02* (2006.01)

(Continued)

(52) U.S. Cl.
CPC ............ *F24F 11/02* (2013.01); *F24F 11/0009* (2013.01); *F24F 13/00* (2013.01); *H01R 27/00* (2013.01);

(Continued)

(58) Field of Classification Search
CPC ......... H01R 27/00; H01R 29/00; H01R 43/00; Y10T 29/49117; Y10T 29/49169; F24F 11/02; F24F 11/009; F24F 13/0023; H05K 13/0023

(Continued)

(56) References Cited

U.S. PATENT DOCUMENTS 7,648,388 B2    1/2010  Kanazawa et al.
7,862,355 B2    1/2011  Chiou et al.

(Continued)

*Primary Examiner* — Khiem Nguyen
(74) *Attorney, Agent, or Firm* — Winstead PC

(57) ABSTRACT

A HVAC unit manufacturing method and a HVAC system are disclosed herein. In one embodiment, the HVAC system includes: a controller having control board terminals, a parallel wiring harness having a first and a second connection header, the first connection header coupled to the control board terminals, and a switch having terminals. The terminals of the switch including: a pair of functional terminals configured to indicate a status of the switch and a pair of jumpered terminals independent of the pair of functional terminals and internally connected together within the switch, wherein designated combinations of the terminals indicate a circuit configuration for employing the switch in the HVAC system with each of the terminals having a particular design that dictates a specific corresponding connection header be used for each of the designated combinations, wherein a single one of the designated combinations of the terminals corresponds to the second connection header.

20 Claims, 11 Drawing Sheets

Related U.S. Application Data continuation of application No. 14/573,047, filed on Dec. 17, 2014, now Pat. No. 9,157,648, which is a division of application No. 12/985,129, filed on Jan. 5, 2011, now Pat. No. 8,939,789.

(51) Int. Cl.
  *H01R 27/00* (2006.01)
  *H01R 29/00* (2006.01)
  *F24F 11/00* (2006.01)
  *F24F 13/00* (2006.01)
  *H05K 13/00* (2006.01)
  *H01R 43/00* (2006.01)

(52) U.S. Cl.
  CPC .............. *H01R 29/00* (2013.01); *H01R 43/00* (2013.01); *H05K 13/0023* (2013.01); *Y10T 29/49117* (2015.01); *Y10T 29/49169* (2015.01); *Y10T 29/49171* (2015.01)

(58) Field of Classification Search
  USPC .................. 439/189, 502, 507–514, 490, 680
  See application file for complete search history.

(56) References Cited

U.S. PATENT DOCUMENTS

| | | |
|---|---|---|
| 7,922,534 B2 | 4/2011 | Lin et al. |
| 8,939,789 B2 | 1/2015 | Lisbona |
| 9,297,549 B2 * | 3/2016 | Lisbona ................ H01R 27/00 |
| 2012/0170174 A1 | 7/2012 | Lisbona |

* cited by examiner

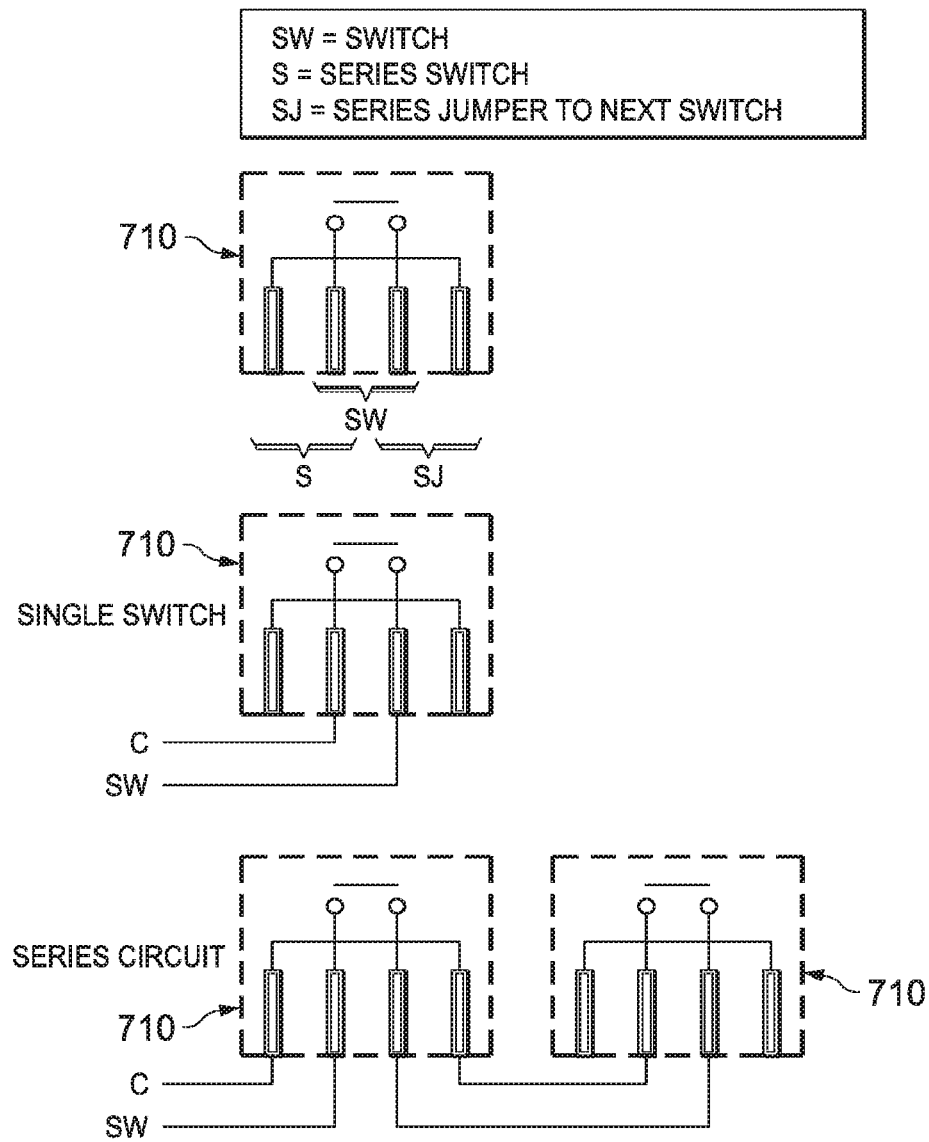

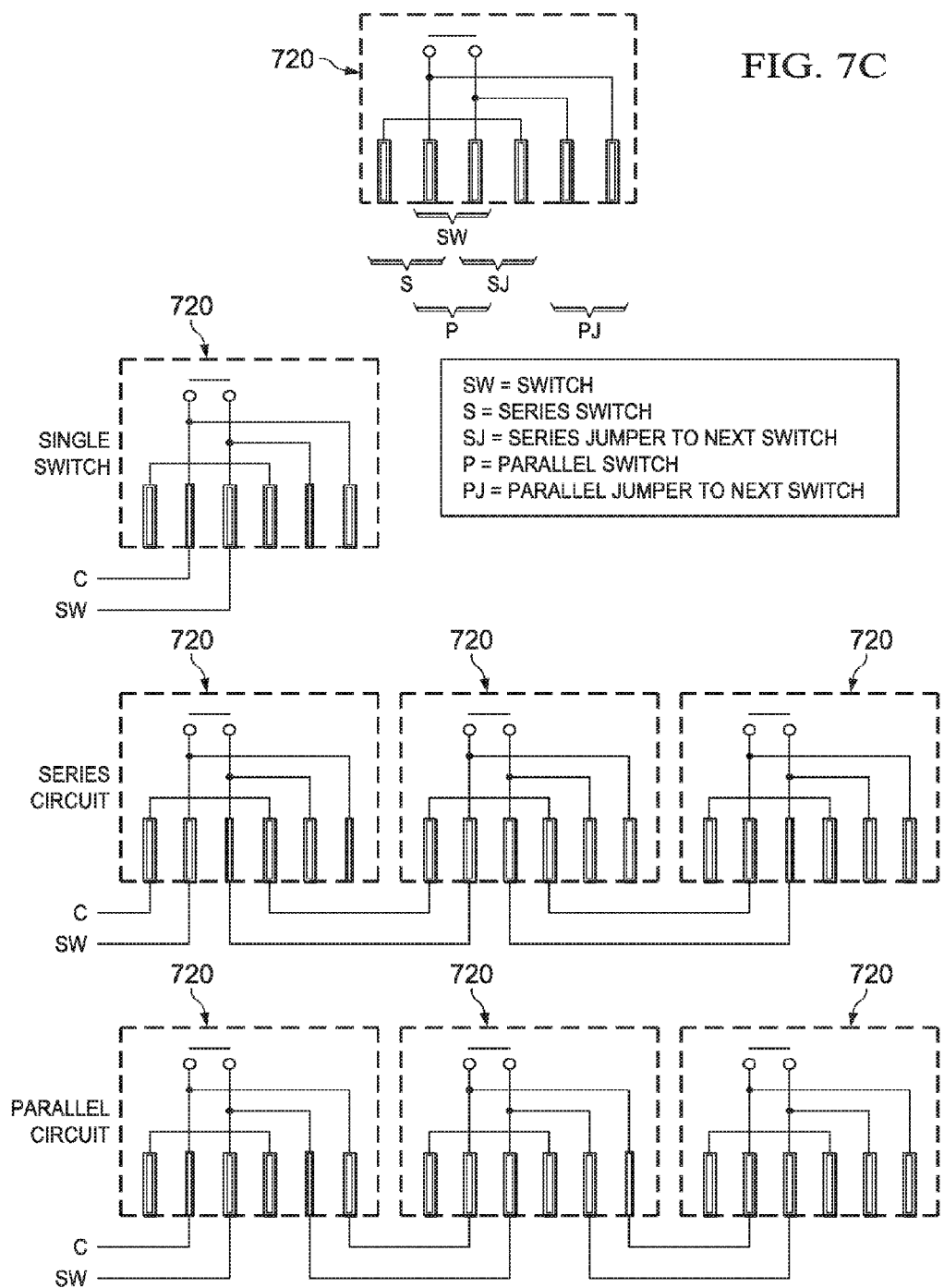

DEVICE EMPLOYABLE IN DIFFERENT CIRCUIT CONFIGURATIONS USING PARALLEL WIRING HARNESSES, A HVAC SYSTEM EMPLOYING THE DEVICE AND A METHOD OF MANUFACTURING A HVAC UNIT

CROSS REFERENCE TO RELATED APPLICATION

This application is a continuation of U.S. patent application Ser. No. 14/840,398, filed on Aug. 31, 2015. U.S. patent application Ser. No. 14/840,398 is a continuation of U.S. patent application Ser. No. 14/573,047, filed on Dec. 17, 2014. U.S. patent application Ser. No. 14/573,047 is a divisional of U.S. patent application Ser. No. 12/985,129, filed on Jan. 5, 2011, which is now U.S. Pat. No. 8,939,789. U.S. patent application Ser. No. 14/840,398, U.S. patent application Ser. No. 14/573,047, and U.S. patent application Ser. No. 12/985,129 are incorporated herein by reference.

TECHNICAL FIELD

This application is directed, in general, to electrical devices and parallel wiring connectors.

BACKGROUND

Heating, Ventilating and Air Conditioning (HVAC) systems use multiple electrical devices that are connected together to perform a desired function. These electrical devices may be common devices that are obtained from third parties and used by various HVAC manufacturers in their particular HVAC units. As such, these electrical devices may have generic terminals, such as spade connectors.

With the generic terminals, the various electrical devices are often connected together using point-to-point wiring. Point-to-point wiring, however, can be labor intensive since individual harnesses are typically made for each particular connection. Point-to-point harnesses can also be more prone to errors. For example, with point-to-point wiring, wires can be connected in multiple positions and can even fit on wrong components. Additionally, with point-to-point harnesses, the harnesses can not be pretested. Instead, they are only tested after installed in the different HVAC units.

As such, it is essentially impossible to mistake proof the wiring during manufacturing of HVAC units when using point-to-point wiring. This can lead to incorrect connections of the wires during manufacturing and assembly. Accordingly, troubleshooting can also be difficult when employing point-to-point wiring with multiple components since faults may be due to wiring problems instead of faulty components. Thus, in addition to problems in manufacturing, it is also easier for the field to make incorrect wiring changes with point-to-point wiring. This can lead to errors in servicing a HVAC unit, which in turn can lead to a malfunction in the operation of the unit.

SUMMARY

One aspect provides a method of manufacturing an HVAC unit. In one embodiment, the method includes: (1) connecting a first device to a second device having multiple terminals employing a first parallel wiring harness, the multiple terminals including a pair of functional terminals connected across a contact of the second device and a pair of jumpered terminals independent of the pair of functional terminals and internally connected together, wherein designated combinations of the terminals indicate a circuit configuration for the electrical device with each of the terminals having a particular design that dictates a specific corresponding connection header be used for each of the designated combinations and (2) connecting the second device to a third device employing a second parallel wiring harness, wherein the third device is a same device as the second device and the first parallel wiring harness has a first connection header configured to connect to one of the designated combinations to implement a particular circuit configuration.

In another aspect, an HVAC system is disclosed. In one embodiment, the HVAC system includes: (1) a controller having control board terminals, (2) a parallel wiring harness having a first and a second connection header, the first connection header coupled to the control board terminals, and (3) a switch having terminals. The terminals of the switch including: (3A) a pair of functional terminals configured to indicate a status of the switch and (3B) a pair of jumpered terminals independent of the pair of functional terminals and internally connected together within the switch, wherein designated combinations of the terminals indicate a circuit configuration for employing the switch in the HVAC system with each of the terminals having a particular design that dictates a specific corresponding connection header be used for each of the designated combinations, wherein a single one of the designated combinations of the terminals corresponds to the second connection header.

BRIEF DESCRIPTION

Reference is now made to the following descriptions taken in conjunction with the accompanying drawings, in which:

FIG. 7A illustrates various circuit configurations and FIGS. 7B, 7C and 7D illustrate schematic diagrams of embodiments of a switch constructed according to the principles of the disclosure and employed in the various configurations of FIG. 7A.

DETAILED DESCRIPTION

Figure 1:
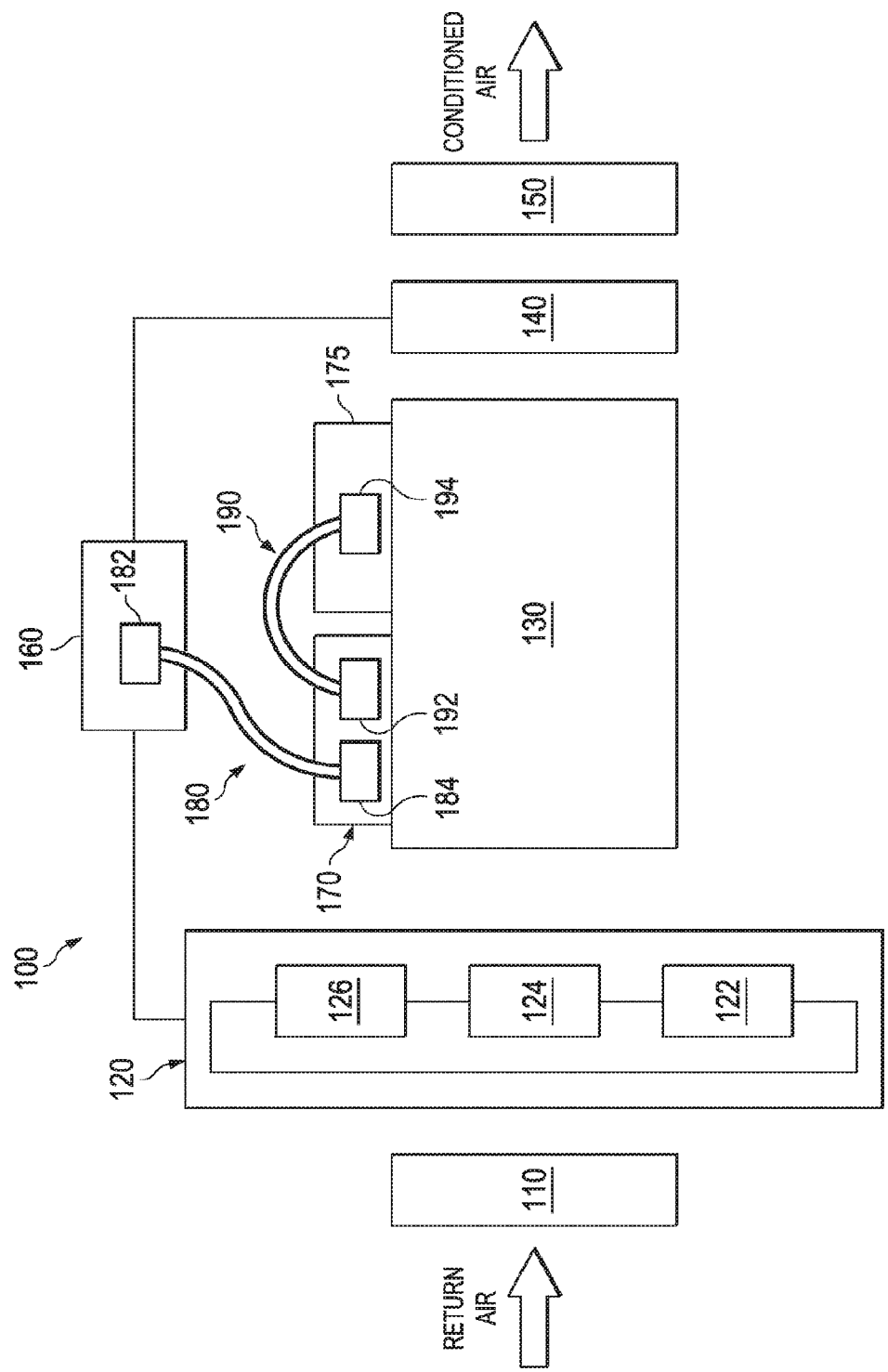
FIG. 1 illustrates a block diagram of an embodiment of an HVAC system constructed according to the principles of the disclosure.

Parallel wiring harnesses have wires that are parallel from one end of the harness to the other without crisscrossed circuits or single ended wires. Even with generic terminals, parallel wiring harnesses may be used with some devices when these devices are used individually in a circuit (i.e., not coupled to at least another one of the devices either in series, in parallel or as a branch circuit). Nevertheless, when multiple of the same devices are employed in a circuit, the parallel wiring harnesses may not be applicable. Instead, point-to-point wiring is used when multiple of the same electrical devices, such as pressure switches or temperature limit switches, are connected in series.

This disclosure provides electrical devices that are constructed for use with parallel wiring harnesses when used in multiple circuit configurations. Thus, parallel wiring harnesses can be used to couple the disclosed devices when used individually in a circuit and also when the same type of devices are used in series, in parallel or in a branch circuit. Accordingly, the disclosed devices can be used in different circuit configurations and still employ parallel wiring harnesses. This allows parallel wiring harnesses to be made for various circuit configurations and pretested before use. As such, the number of wiring errors in, for example, HVAC units, can be reduced.

In many HVAC applications, various components have to be electrically connected or serviced in the field. In such instances, the service technician must make the appropriate connections when either assembling the HVAC system or servicing an in-place unit. Often in HVAC systems, such as HVAC rooftop units, the wiring schemes can be very complicated, which increases the chance of a wrong electrical connection being made. The disclosed electrical devices are designed to reduce the number of erroneous connections being made during manufacturing, installation or servicing.

The disclosed electrical devices include functional terminals that are coupled across a contact of the electrical devices. The contact may be a normally opened contact or a normally closed contact. The contact may indicate operation or non-operation of the electrical devices. The electrical devices, for example, may be switches, such as pressure switches or limit switches.

Additionally, the disclosed electrical devices include a pair of jumpered terminals that are independent of the functional terminals and are internally connected together inside of the electrical device. The jumpered terminals allow parallel wiring connectors to be coupled to the electrical device regardless if the electrical device is used individually in a circuit or with another electrical device in a circuit (e.g., two of the electrical devices in series). Thus, parallel wiring harnesses can be used with a single device or with multiple of the same devices in different circuit configurations. Additionally, the terminals of the disclosed electrical devices are designed for corresponding connection headers to dictate the circuit configuration in which the electrical device is used. Accordingly, designated combinations of the terminals indicate a circuit configuration for the electrical device with each of the terminals having a particular design that dictates a specific corresponding connection header be used for each of the designated combinations. The connection headers, therefore, are configured to correspond to designated terminals of the disclosed electrical devices for particular circuit configurations. As such, the connection headers include connectors that are designed to correspond to designated terminals of the electrical device in a mating interface that indicates a particular circuit configuration for the electrical device.

In some embodiments, the disclosed electrical devices may include terminals that are keyed or polarized for the various circuit implementations in which the electrical devices are employed. For example, the terminals may be Raster Anschluss Steck Technik (RAST) compliant connectors or another type of pitch connection plug technology connector. The centerline spacing of the RAST connectors may be five millimeters, two-and-a-half millimeters or another distance. In addition to keys, the terminals may have latch mechanisms (e.g., latches) that maintain the interconnection between designated terminals and corresponding connection headers.

FIG. 1 illustrates a block diagram of an embodiment of an HVAC system constructed according to the principles of the disclosure. The HVAC system 100 includes a return air duct 110, a refrigeration circuit 120, an air moving unit 130, a heat exchanger 140, a supply air duct 150, a HVAC controller 160, a first pressure switch 170 and a second pressure switch 175. The HVAC system 100 also includes a first parallel wiring harness 180 and a second parallel wiring harness 190.

The refrigeration circuit 120 includes a compressor system 122, evaporator coils 124, and condenser coils 126 that are fluidly coupled together. The refrigeration circuit 120 may include multiple cooling stages. One skilled in the art will understand that the HVAC system 100 may include additional components and devices that are not presently illustrated or discussed but are typically included in an HVAC system, such as, a power supply, an expansion valve and a condenser fan. A thermostat (not shown) is also typically employed with the HVAC system 100 and used as a user interface. The various illustrated components of the HVAC system 100 may be contained within a single housing (e.g., a cabinet). In one embodiment, the HVAC system 100 may be a rooftop unit.

The return air duct 110 and the supply air duct 150 may be conventional ducts used in common HVAC systems to receive return air and discharge conditioned air. The refrigeration circuit 120, the air moving unit 130, the heat exchanger 140 and the HVAC controller 160 may also be conventional components that are typically employed in HVAC systems. The HVAC controller 160 causes the air moving unit 130 to move the return air across the evaporator coils 124 for cooling and through the heat exchanger 140 for heating to provide conditioned air for the conditioned air space. Operation of the HVAC system 100 can be controlled by the HVAC controller 160 based on inputs from various sensors of the HVAC system 100 and from a thermostat.

The first pressure switch 170 and the second pressure switch 175 are used to determine if the air moving unit 130 has created a desired air flow through the HVAC system 100. The first and second pressure switches 170, 175, may be located in the scroll of the air moving unit 130. In other embodiments, the first and second fans 170, 175, may be located in duct work of the HVAC system 100. The first pressure switch 170 is connected to the controller 160 via the first parallel wiring harness 180 and is connected to the second pressure switch 175 via the second parallel wiring harness 190. In this embodiment, the first and second pressure switches 170, 175, may be connected in a branch circuit. In other embodiments, the first and second pressure switches 170, 175, can be connected in series. The particular circuit configuration may be determined by a connection header that is used and that uniquely corresponds to designated terminals which dictate the particular configuration of the first and second pressure switches 170, 175.

The first parallel wiring harness 180 includes a first connection header 182 and a second connection header 184. The second parallel wiring harness 190 also includes a first connection header 192 and a second connection header 194. The first connection header 182 is configured to connect to the controller 160 and the second connection header 184 is configured to connect to the first pressure switch 170. The first connection header 192 is configured to connect to the first pressure switch 170 and the second connection header 194 is configured to connect to the second pressure switch 175. As such, the connection headers include connectors that correspond to terminals of the controller 160, the first pressure switch 170 and the second pressure switch 175. The terminals (not illustrated) are configured to receive the corresponding connectors. The terminals of the first and second pressure switches 170, 175, include a pair of functional terminals connected across a contact thereof and a pair of jumpered terminals independent of the pair of functional terminals and internally connected together. Each unique pair of the terminals of the first and second pressure switch 170, 175, indicate a circuit configuration for the switches 170, 175, with each of the terminals having a particular design that dictates a specific corresponding connection header be used for each unique pair of the terminals.

Figure 2:
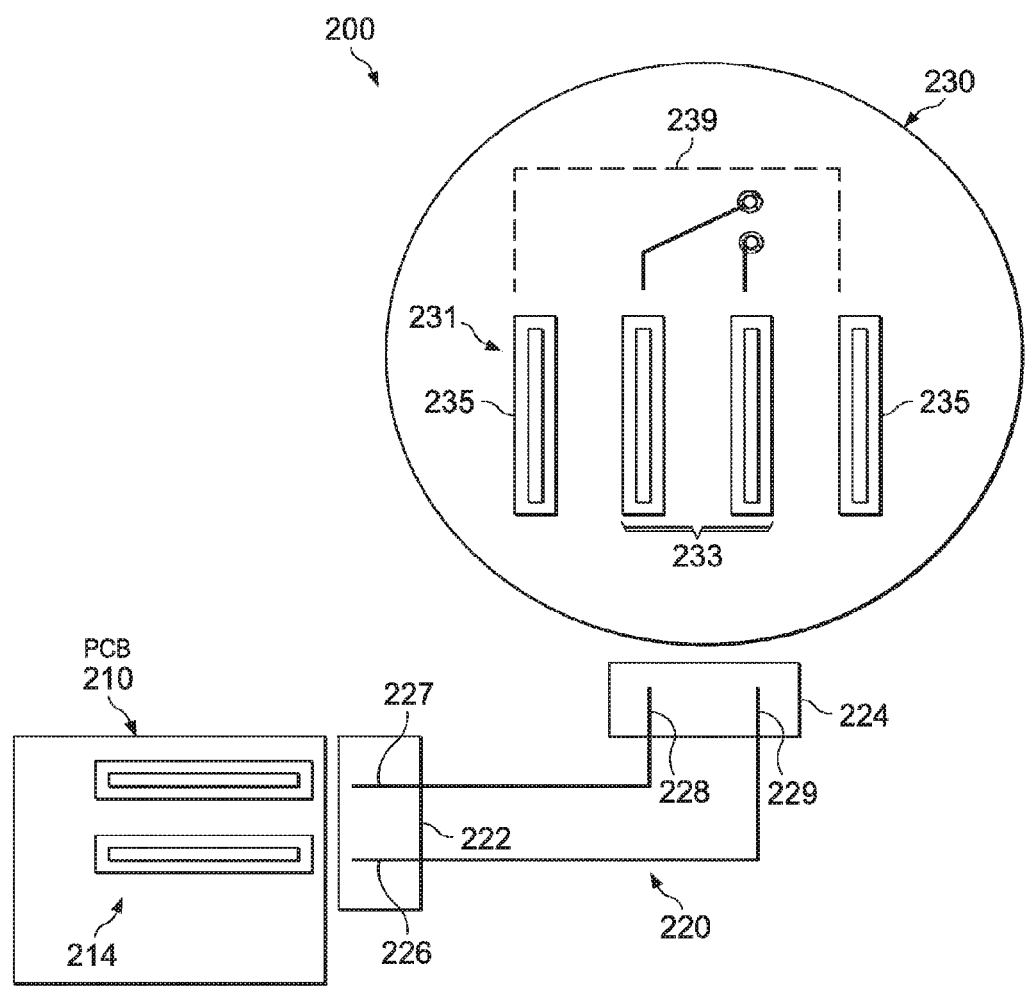
FIG. 2 illustrates a diagram of an embodiment of a single electrical device employed in a circuit and constructed according to the principles of the disclosure.

FIG. 2 illustrates a diagram of an embodiment of a single electrical device employed in a circuit 200. The circuit 200 includes a printed circuit board (PCB) 210, a parallel wiring harness 220 and an electrical device 230. The electrical device 230 is constructed according to the principles of the disclosure. In one embodiment, the circuit 200 may be employed in a HVAC system, such as the HVAC system 100 illustrated in FIG. 1. The PCB 210 may be part of a controller of an HVAC system such as the controller 160.

The PCB 210 includes a pair of terminals denoted as control board terminal pair 214. The electrical device 230 also includes terminals 231 including functional terminals 233 and jumpered terminals 235. The functional terminals 233 are coupled across a contact of the electrical device 230. In this embodiment, the electrical device 230 is a switch and the functional terminals 233 are coupled across a contact indicating the status of the switch. The jumpered terminals 235 are internally coupled together (i.e., connected together inside of the electrical device 230) via an internal jumper 239 and are not coupled to the functional terminals 233. The internal jumper 239 may be a conventional jumper.

Coupled to the PCB 210 via the control board terminal pair 214 is the parallel wiring harness 220. The parallel wiring harness 220 includes a first connection header 222 and a second connection header 224. The first connection header 222 is configured to connect to the control board terminal pair 214. As such, the first connection header 222 includes connectors 226, 227, that are designed to correspond to the control board terminal pair 214. Accordingly, the control board terminal pair 214 and the first connection header 222 are paired together to prevent incorrect wiring. The second connection header 224 is configured to connect to the functional terminals 233. As such, the second connection header 222 includes connectors 228, 229, that are designed to correspond to the functional terminals 233.

Accordingly, the functional terminals 233 and the second connection header 224 are paired together to prevent incorrect wiring when a single electrical device 230 is used. When multiple of the electrical devices 230 are used in a circuit, instead of the second connection header 224, another connection header having differently configured connectors would be used to correspond to one of the functional terminals 233 and one of the jumpered terminals 235. Another parallel wiring harness, therefore, can be used to connect the other one of the functional terminals 233 and the other one of the jumpered terminals 235 to another one of the electrical device.

Figure 3:
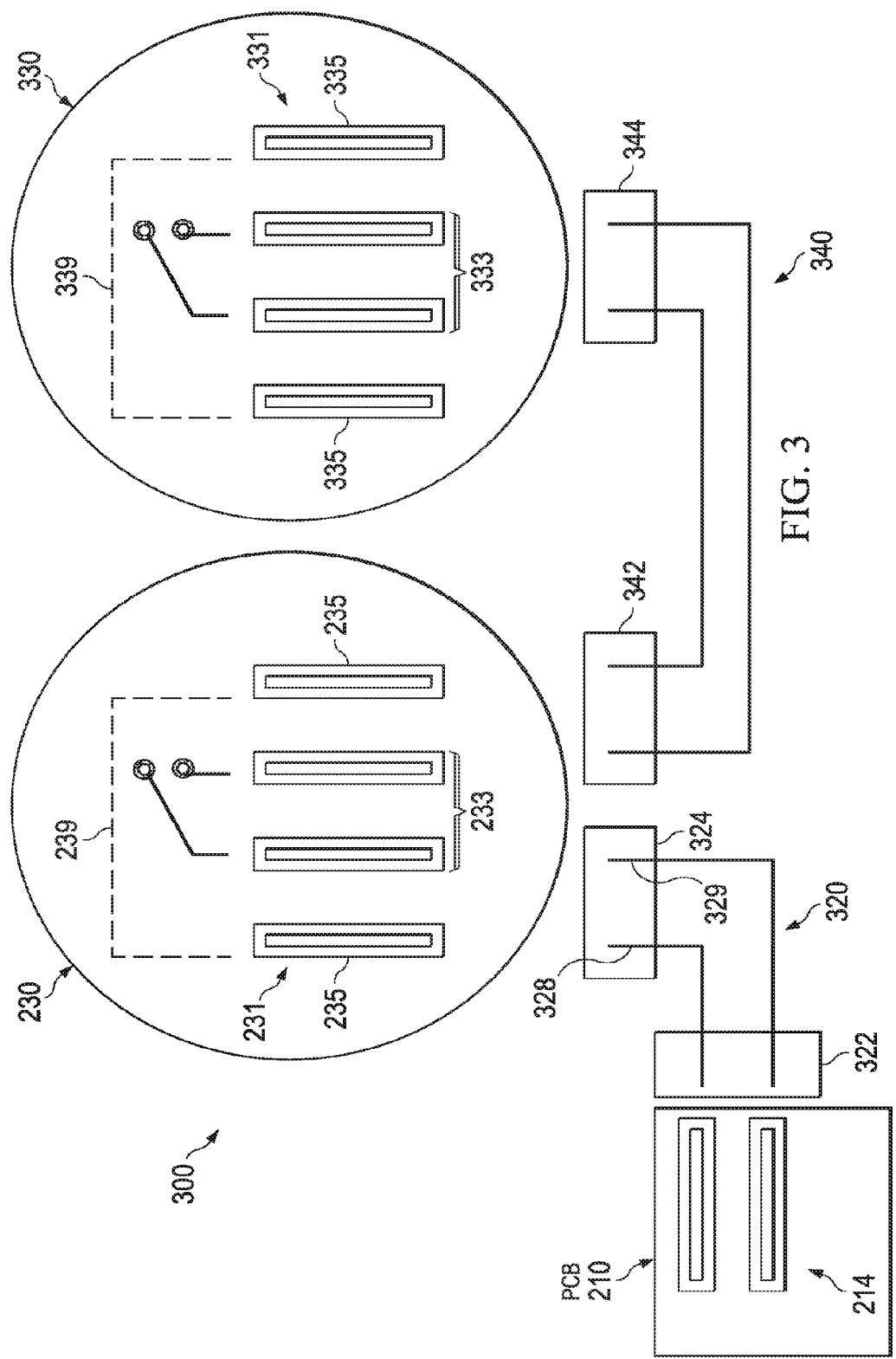
FIG. 3 illustrates a diagram of two electrical devices as illustrated in FIG. 2 connected in series.

FIG. 3 illustrates a diagram of two electrical devices as illustrated in FIG. 2 connected in series. FIG. 3 includes the PCB 210 and the electrical device 230 including the terminals 231. FIG. 3 also includes the same type of electrical device, 330 connected in series with the electrical device 230. As such, the electrical device 330 includes terminals 230 including functional terminals 333 and jumpered terminals 335 that are internally connected by the jumper 339. The functional terminals 333 are coupled across a contact of the electrical device 330.

A first parallel wiring harness 320 and a second parallel wiring harness 340 are illustrated. The first parallel wiring harness 320 includes a first connection header 322 and a second connection header 324. The first connection header 322 may be the same as the first connection header 222 of FIG. 2. The second connection header 324, however, differs from the second connection header 224 of FIG. 2. Instead of being configured for a single switch circuit that corresponds to the functional terminals 233, the second connection header 324 is configured to couple to one of the functional terminals 233 and one of the jumpered terminals 235 to allow a series connection between the electrical device 230 and the electrical device 330 in a multiple switch circuit.

The second parallel wiring harness 340 then connects the electrical device 230 to the electrical device 330. The second parallel wiring harness 340 includes a first connection header 342 that is configured to couple to one of the functional terminals 233 and one of the jumpered terminals 235. The second parallel wiring harness also includes a second connection header 344 that is configured to connect to the functional terminals 333 of the electrical device 330. The second connection header 344 may be configured the same as the second connection header 224 of FIG. 2. As noted with respect to connection headers of FIG. 2, each of the connection headers of FIG. 3 include connectors that are designed to correspond to particular terminals. As an example, connectors 328 and 329 of the connection header 324 are denoted in FIG. 3. The connectors 328, 329, of the connection header 324 are configured to correspond to one of the jumpered terminals 235 and one of the functional terminals 233 as illustrated in FIG. 3. In one embodiment, the correspondence therebetween may be unique.

Figure 4:
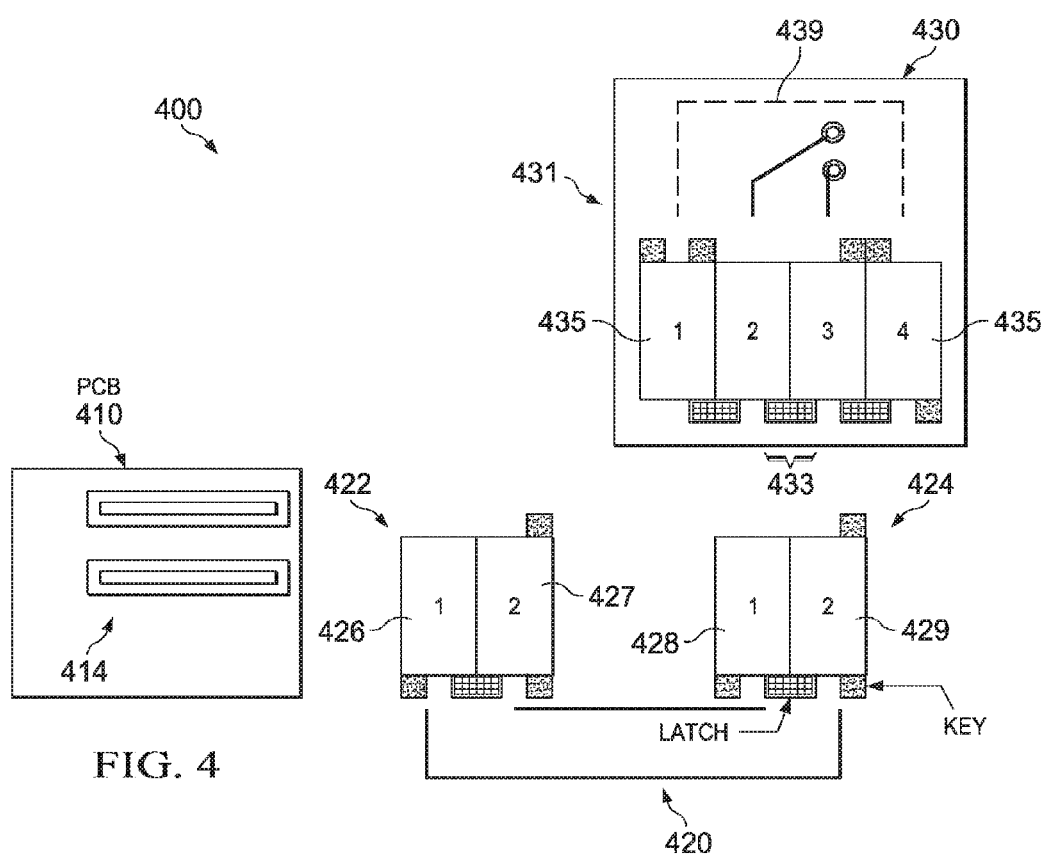
FIG. 4 illustrates a connection diagram of another embodiment of a single electrical device constructed according to the principles of the disclosure that has terminals which are keyed for designated mating interfaces.

FIG. 4 illustrates a connection diagram of an embodiment of a single electrical device 430 constructed according to the principles of the disclosure that has terminals which are keyed for designated mating interfaces. The terminals are designed with keying feature to prevent misconnections. For example, the terminals and connection header illustrated in FIG. 4 may be RAST compliant connectors. A single key and a single latch are denoted in FIG. 4. The keys of the terminals and the keys of the connection headers are designed to correspond to form designated mating interfaces. The latches may be used to secure the connections once coupled.

The circuit 400 includes a PCB 410, a parallel wiring harness 420 and the electrical device 430. The electrical device 430 is constructed according to the principles of the disclosure. In one embodiment, the circuit 400 may be employed in a HVAC system, such as the HVAC system 100 illustrated in FIG. 1. The PCB 410 may be part of a controller of an HVAC system such as the controller 160.

The PCB 410 includes a pair of terminals denoted as control board terminal pair 414. The electrical device 430 also includes terminals 431 including functional terminals 433 and jumpered terminals 435. The functional terminals 433 (denoted as terminals 2 and 3 of the terminals 431) are coupled across a contact of the electrical device 430. In this embodiment, the electrical device 430 is a switch and the functional terminals 433 are coupled across a contact indicating the status of the switch. The jumpered terminals 435 (denoted as terminals 1 and 4 of the terminals 431) are internally coupled together via an internal jumper 439 and are not coupled to the functional terminals 433.

Coupled to the PCB 410 via the control board terminal pair 414 is the parallel wiring harness 420. The parallel wiring harness 420 includes a first connection header 422 and a second connection header 424. The first connection header 422 is configured to connect to the control board terminal pair 414. As such, the first connection header 422 includes connectors 426, 427, that are keyed to correspond to the control board terminal pair 414. Accordingly, the control board terminal pair 414 and the first connection header 422 are paired together as a designated mating interface to prevent incorrect wiring. The second connection header 424 is configured to connect to the functional terminals 433. As such, the second connection header 422 includes connectors 428, 429, that are keyed to correspond to the functional terminals 433. Accordingly, the functional terminals 433 and the second connection header 424 are paired together as a designated mating interface to prevent incorrect wiring when a single electrical device 430 is used. When multiple of the electrical devices 430 are used in a circuit, a different connection header is needed instead of the second connection header 424 to correspond to one of the functional terminals 433 and one of the jumpered terminals 435. Another parallel wiring harness can then be used to connect the other one of the functional terminals 433 and the other one of the jumpered terminals 435 to another one of the electrical device.

Figure 5:
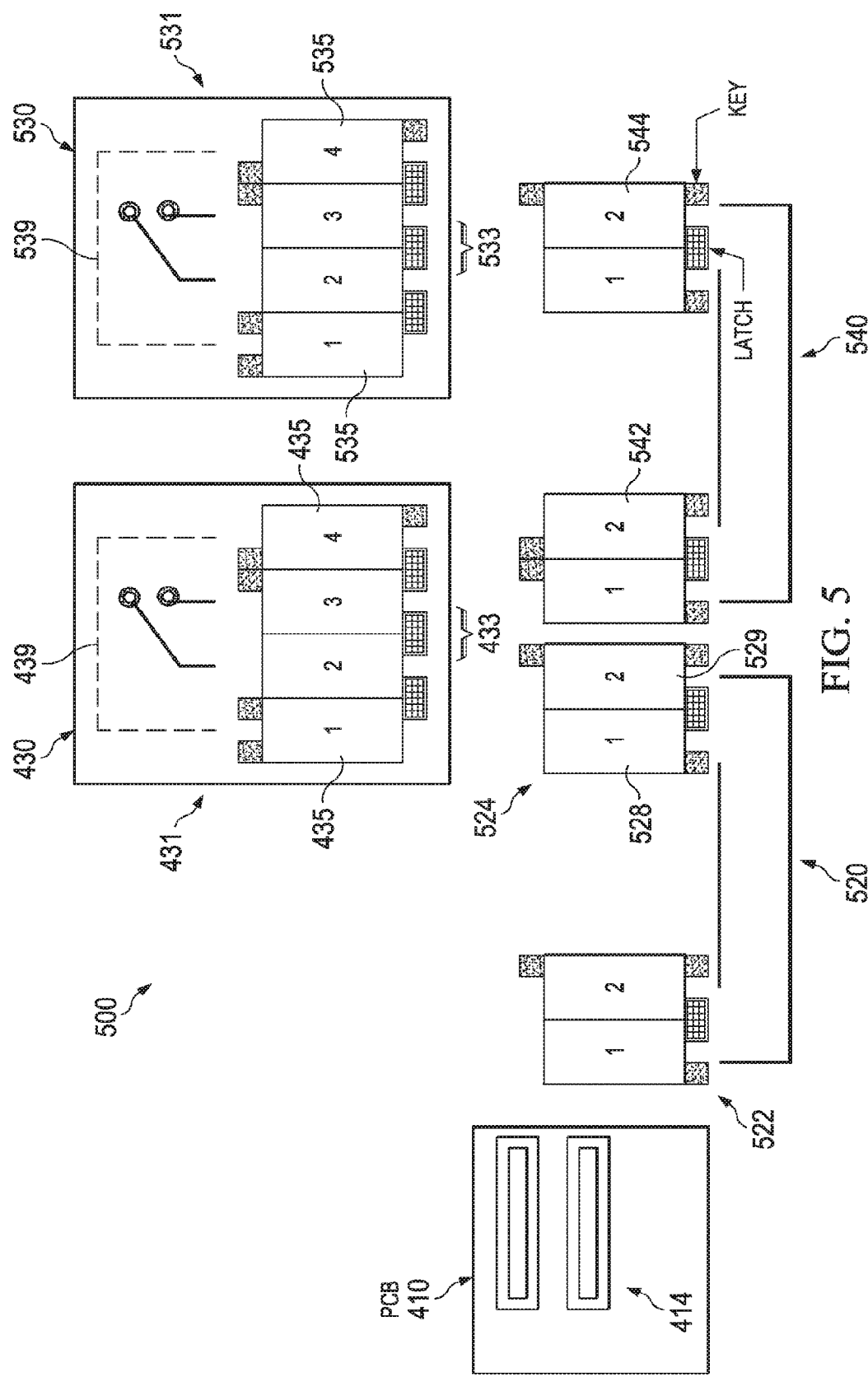
FIG. 5 illustrates a connection diagram of a circuit configuration having two of the electrical devices of FIG. 4 coupled in series.

FIG. 5 illustrates a connection diagram of a circuit configuration 500 having two of the electrical devices of FIG. 4 coupled in series. FIG. 5 includes the PCB 410 and the electrical device 430 including the terminals 431. FIG. 5 also includes the same type of electrical device, 530 connected in series with the electrical device 430. As such, the electrical device 530 has terminals 531 including functional terminals 533 and jumpered terminals 535 that are internally connected by an internal jumper 539. The functional terminals 533 are coupled across a contact of the electrical device 530. A single key and latch are identified in FIG. 5.

A first parallel wiring harness 520 and a second parallel wiring harness 540 are illustrated. The first parallel wiring harness 520 includes a first connection header 522 and a second connection header 524. The first connection header 522 may be the same as the first connection header 422 of FIG. 4. The second connection header 524, however, differs from the second connection header 424 of FIG. 4. Instead of being configured for a single connection that corresponds to the functional terminals 433, the second connection header 524 is configured to couple to terminal "1" of the functional terminals 433 and terminal "2" of the jumpered terminals 435 to signify a series connection between the electrical device 430 and the electrical device 530.

The second parallel wiring harness 540 then connects the electrical device 430 to the electrical device 530. The second parallel wiring harness 540 includes a first connection header 542 that is configured to couple to terminal "3" of the functional terminals 433 and terminal "4" of the jumpered terminals 435. The second parallel wiring harness 540 also includes a second connection header 544 that is configured to connect to the functional terminals 533 of the electrical device 530. The second connection header 544 may be configured the same as the second connection header 424 of FIG. 2.

As noted with respect to connection headers of FIG. 4, each of the connection headers of FIG. 5 include connectors that are designed to correspond to particular terminals. As an example, connectors 528 and 529 of the connection header 524 are denoted in FIG. 5. The connectors 528, 529, of the connection header 524 are configured to correspond to one of the jumpered terminals 435, terminal "1," and one of the functional terminals 433, terminal "2," as illustrated in FIG. 5. In one embodiment, the correspondence therebetween may be unique.

Figure 6A:
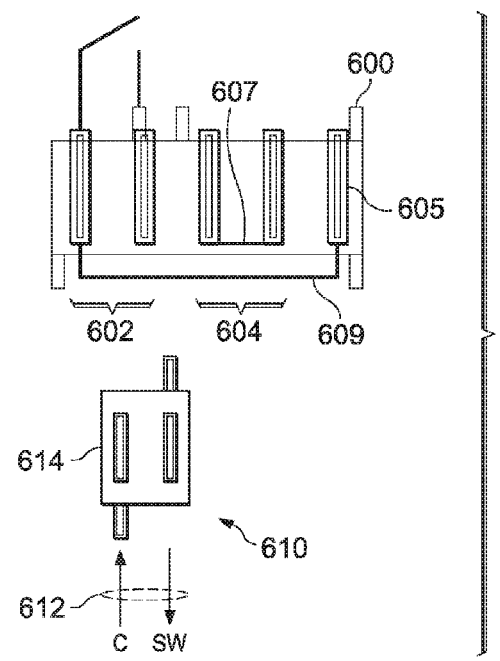
FIGS. 6A, 6B and 6C illustrate schematic diagrams of yet another embodiment of an electrical device constructed according to the principles of the disclosure.
Figure 6B:
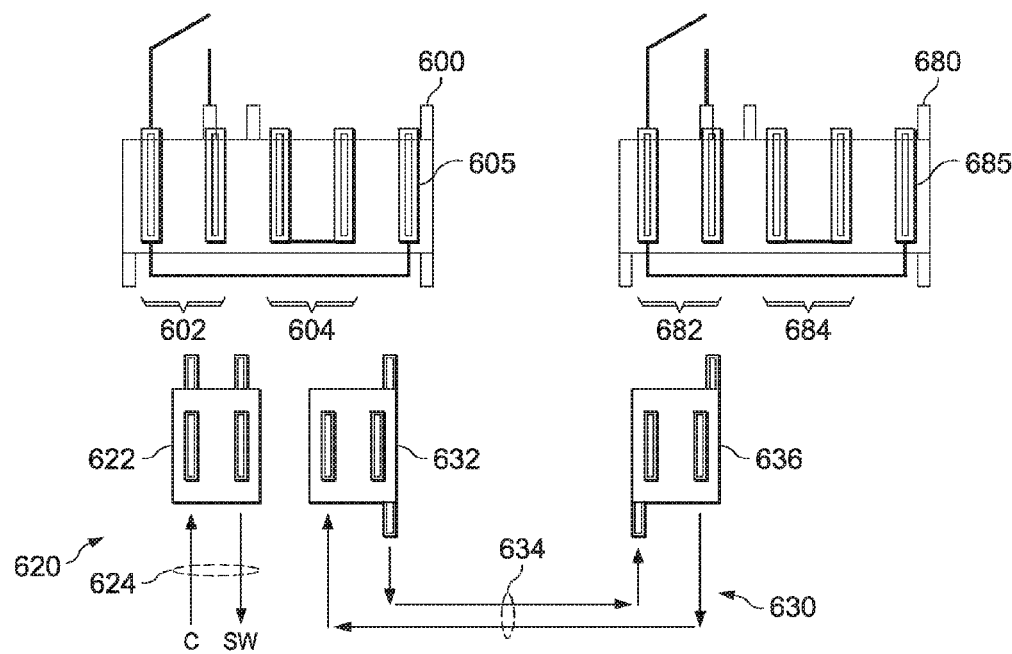
Figure 6C:
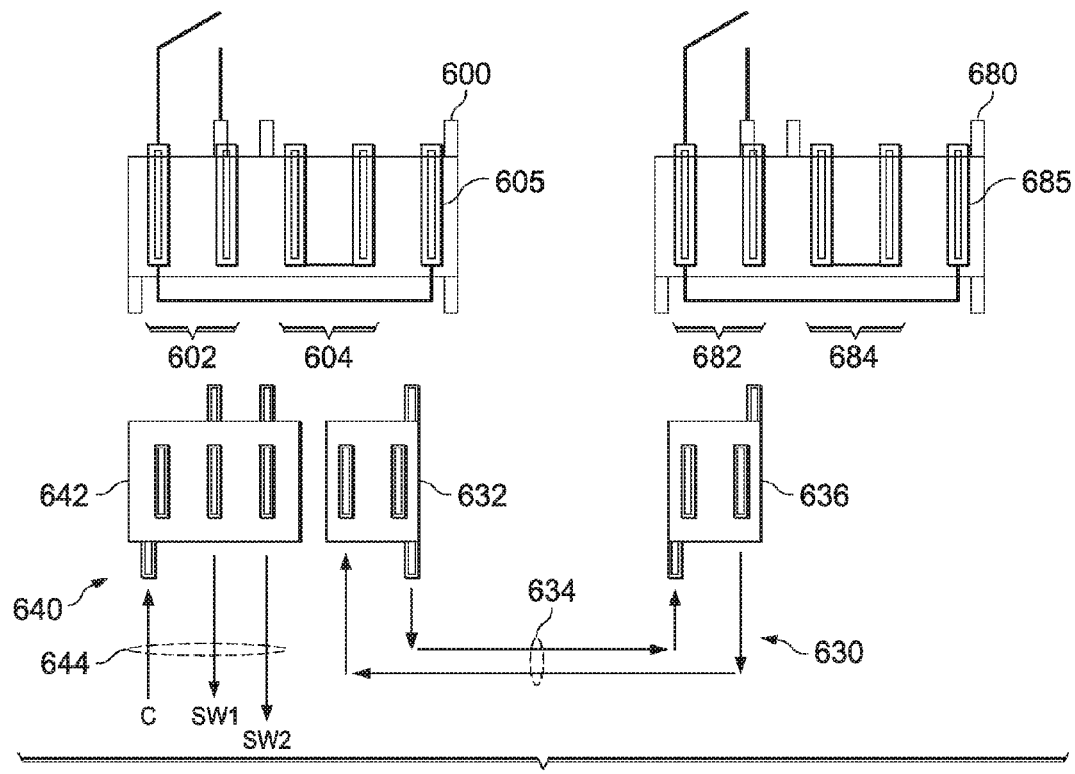

FIGS. 6A, 6B and 6C illustrate schematic diagrams of another embodiment of an electrical device 600 constructed according to the principles of the disclosure. The electrical device 600 is a switch. One skilled in the art will understand that the electrical device may be another device besides a switch. The electrical device 600 has multiple terminals including a pair of functional terminals 602, a pair of jumpered terminals 604 and a common terminal 605. The functional terminals 602 are coupled across a contact of the electrical device 600. The jumpered terminals 604 are independent of the functional terminals 602 and are internally connected together inside the electrical device 600. The common terminal 605 is independent of the jumpered terminals 604 and is internally connected to the common terminal of the switch. The internal jumpers are denoted in FIG. 6A as jumper 607 and jumper 609.

FIGS. 6A, 6B and 6C represent the electrical device 600 in different circuit configurations. In each drawing, the electrical device 600 may be coupled, via a parallel wiring harness, to a control board to complete the circuit configurations. The various parallel wiring harnesses include cables that can be coupled to a common terminal (represented by "c" in the FIGS. 6A, 6B and 6C) and return cables that can be coupled to designated terminals on the control board. The connection headers for connecting to the control board are not illustrated in FIG. 6A, 6B or 6C. The various connection headers illustrated in FIGS. 6A, 6B and 6C may be configured similarly to the connection headers in the preceding figures.

In FIG. 6A, the electrical device 600 is connected to a single parallel wiring harness 610 representing when a single electrical device 600 is in a single switch circuit. The parallel wiring harness 610 includes a connection header 612 and cables 614. The connection header 612 includes connectors that are configured to connect to the functional terminals 602.

In FIG. 6B, the electrical device 600 is connected to a second electrical device 680 in series. Accordingly, the electrical device 680 has multiple terminals including a pair of functional terminals 682, a pair of jumpered terminals 684 and a common terminal 685. In this configuration, two parallel wiring harnesses are used. A first parallel wiring harness 620 includes a connection header 622 and cables 624. A second parallel wiring harness 630 includes a first connection header 632, cables 634 and a second connection header 636. The connection header 622 includes connectors that are configured to connect to one of the functional terminals 602 and one of the jumpered terminals 604. The connection header 632 includes connectors that are configured to connect to one of the jumpered terminals 604 and the common terminal 605. The connection header 636 includes connectors that are configured to connect to the functional terminals 682.

In FIG. 6C, the electrical device 600 is connected to the second electrical device 680 as a branch circuit. In this configuration, two parallel wiring harnesses are also used. A first parallel wiring harness 640 includes a connection header 642 and cables 644. For the branch connection, the parallel wiring harness 640 includes three cables include a common cable and return cables from two switches. With a dedicated cable for each switch, the status of a particular switch can be determined, by, for example, a HVAC controller. The second parallel wiring harness in FIG. 6C may be the parallel wiring harness 630 of FIG. 6B. The connection header 642 includes connectors that are configured to connect to the functional terminals 602 and one of the jumpered terminals 604.

Figure 7A:
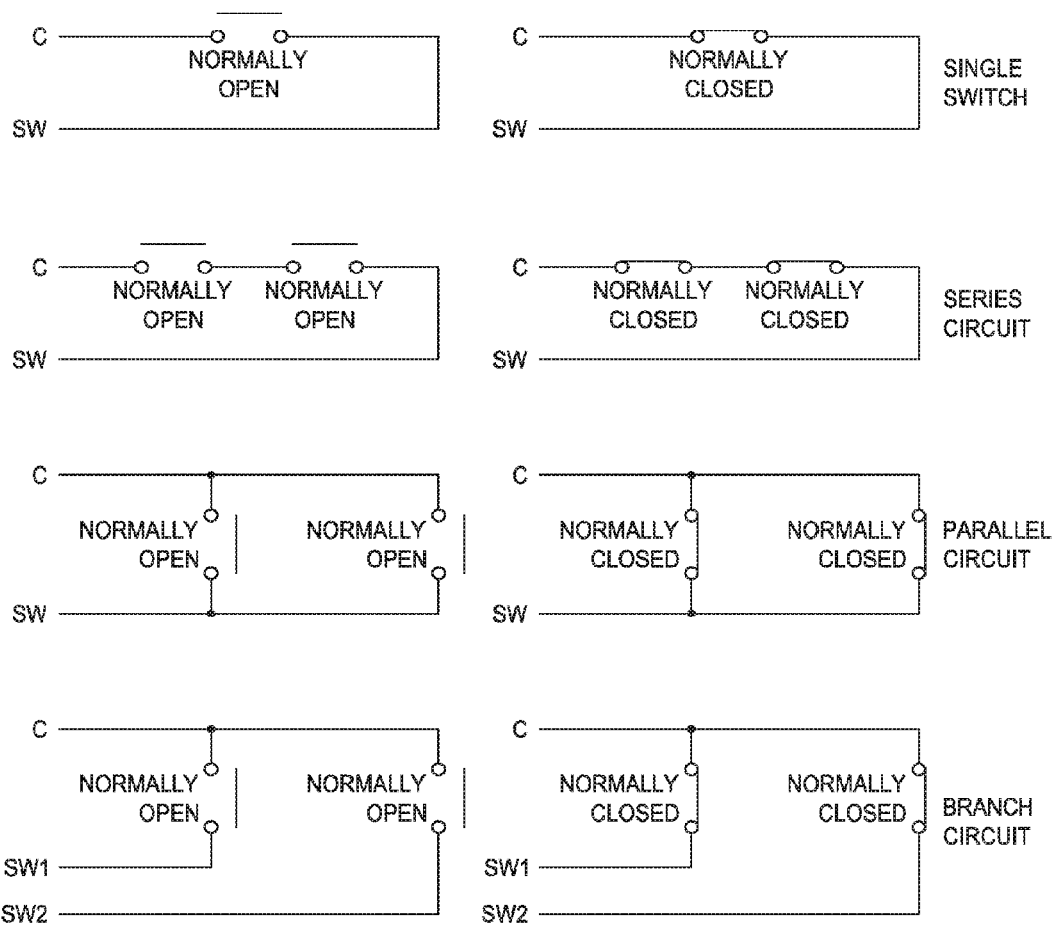

FIG. 7A illustrates schematic diagrams of different circuit configurations having electrical devices. The electrical device or devices in FIG. 7A is a switch. In other embodiments, the electrical device or devices may be another type of device. Four different types of circuits employing a switch are illustrated in a normally open and normally closed condition. The four types of circuits are a single switch, a series circuit, a parallel circuit and a branch circuit. A common terminal (C) and the various switch terminals (SW, SW1 and SW2) are illustrated in FIG. 7A along with the condition of the switches.

Figure 7D:
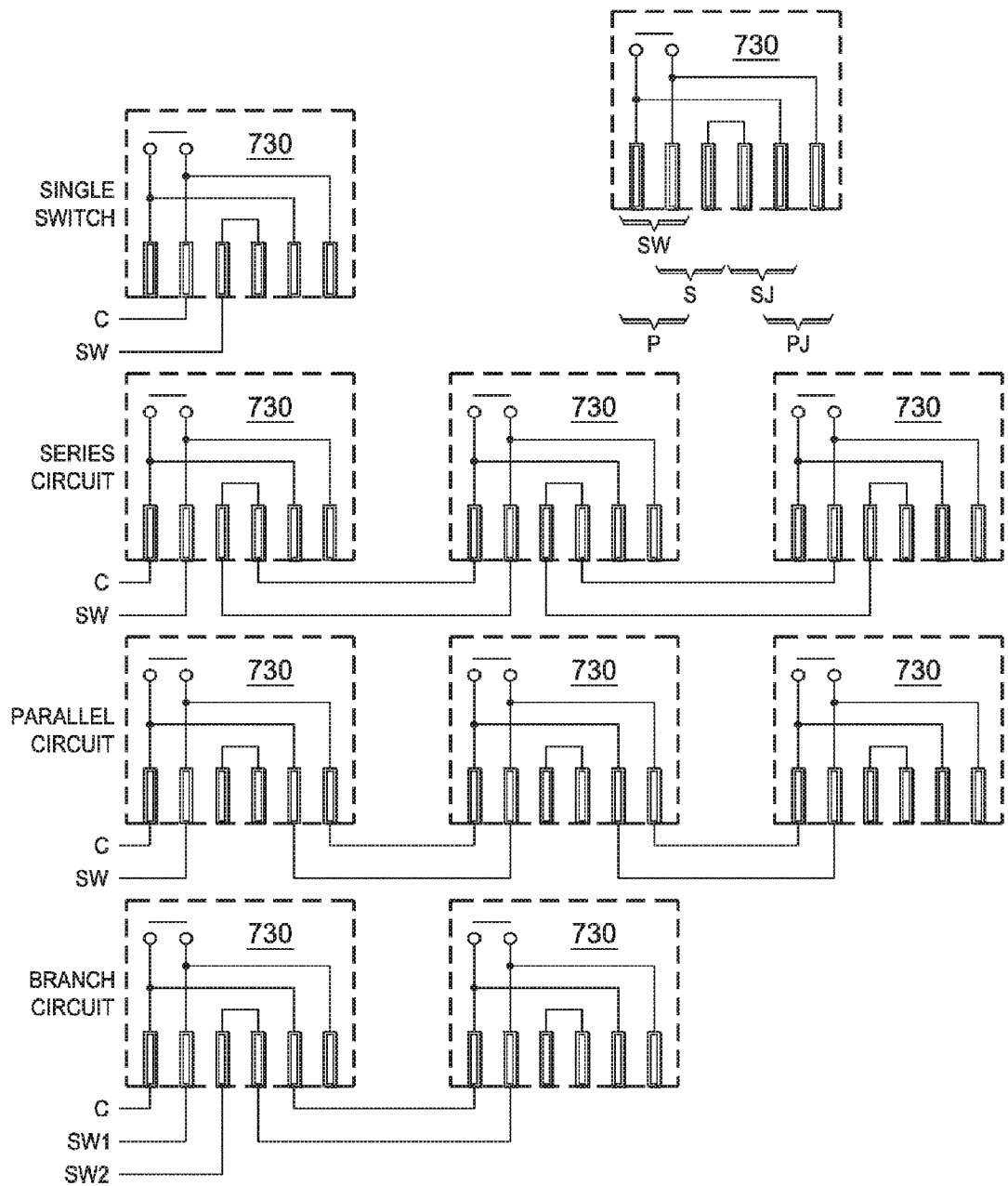

FIGS. 7B, 7C and 7D illustrate schematic diagrams of embodiments of switches constructed according to the principles of the disclosure that may be employed in the various circuit configurations of FIG. 7A. In FIG. 7B a switch 710 is illustrated. The switch 710 corresponds to the electrical device 230 of FIG. 2. In FIG. 7B, the switch 710 is connected in a single switch circuit and in a series circuit. Parallel wiring harnesses may be used to couple the switch 710 to form the various circuit configurations.

In FIG. 7C, another switch 720 is illustrated. Unlike switch 710, switch 720 includes six terminals and three different internal jumpers. The different internal jumpers allows the switch 720 to be used as a single device and to be coupled in series or parallel. As with switch 710, parallel wiring harnesses can be used to couple the switch 720 in the different configurations.

In FIG. 7D, yet another switch 730 is illustrated. The switch 730 also includes six terminals and multiple internal jumpers. Unlike switch 720, the switch 730 has internal jumpers that allow it to be employed as a single device, in a series circuit, a parallel circuit and a branch circuit. Parallel wiring harnesses may also be employed with the switch 730 to form the various circuit configurations. The parallel wiring harnesses employed with the switches 710, 720 and 730 may be similarly configured as the parallel wiring harnesses previously discussed herein. While switch 710 includes four terminals, switches 720 and 730 include six terminals. Switch 710 includes a pair of functional terminals and a pair of jumpered terminals. Switches 720 and 730 also include a pair of functional terminals and a pair of jumpered terminals. Additionally, switches 720 and 730 include other terminals that are each internally jumpered to one of the functional terminals.

Figure 8:
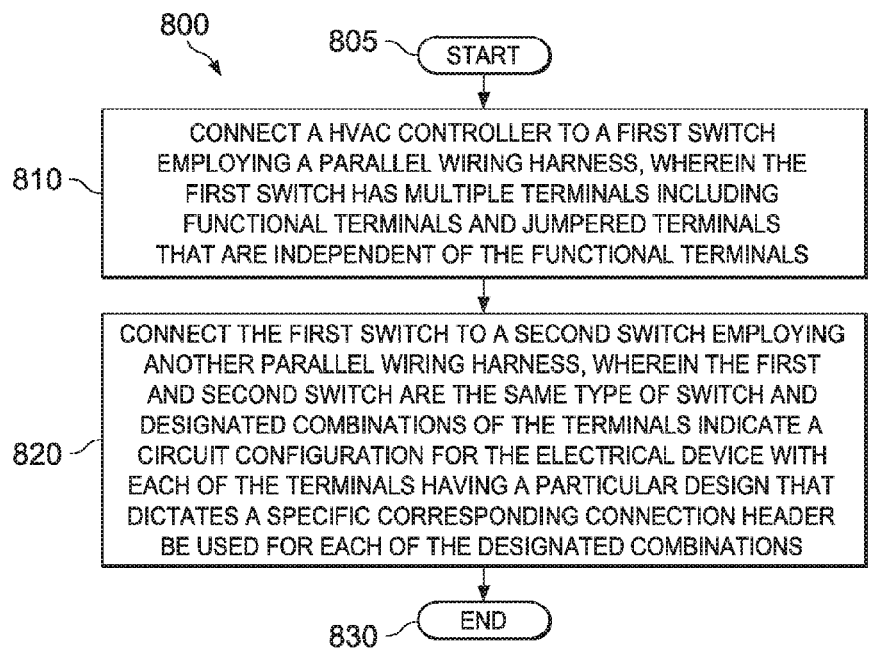
FIG. 8 illustrates a flow diagram of an embodiment of a method of manufacturing an HVAC unit carried out according to the principles of the disclosure.

FIG. 8 illustrates a flow diagram of an embodiment of a method 800 of manufacturing a HVAC unit according to the principles of the disclosure. The HVAC unit may be a rooftop unit. The method begins in a 805.

In a step 810, a HVAC controller is connected to a first switch employing a parallel wiring harness. The first switch includes multiple terminals including functional terminals and jumpered terminals that are independent of the functional terminals. The functional terminals are coupled across the switching component of the switch and can be used to indicate the status of the switch (e.g., open or closed). The jumpered terminals are internally connected within the switch. In some embodiments, the first switch may include an additional terminal that is internally connected to one of the functional terminals. Designated combinations of the terminals indicate a circuit configuration for the switch in the HVAC unit. A designated combination may be a pair of the terminals or even three of the terminals. Each of the terminals of the first switch have a particular design that dictates a specific corresponding connection header be used for each of the designated combinations.

In a step 820, the first switch is connected to a second switch employing another parallel wiring harness. The second switch is the same type of switch as the first switch. The first switch may be coupled to the second switch in series or in a branch circuit. The same switch, therefore, can be used for different circuit configurations, including being used singularly, for a series connection or a branch connection. The method 800 then ends in a step 830.

The devices disclosed herein include terminals with internal jumpers that allow parallel harnesses to be used with the device in multiple circuit configurations. The sequence of the jumpered terminals relative to the other terminals of the device is designed for particular circuit configurations. A certain sequence is needed for the parallel wiring harnesses to function properly as desired. The terminals are positioned for a single connector position to be used when a single device circuit is implemented. Other positions may be used for series, branch or parallel circuit configurations.

Those skilled in the art to which this application relates will appreciate that other and further additions, deletions, substitutions and modifications may be made to the described embodiments.

What is claimed is:

1. A method of manufacturing a Heating, Ventilating and Air Conditioning (HVAC) unit, the method comprising:
   interoperably coupling, using a first parallel wiring harness, a controller to a first electrical device, wherein the first electrical device comprises a plurality of terminals;
   interoperably coupling, using a second parallel wiring harness, the first electric device to a second electrical device;
   wherein designated combinations of the plurality of terminals specify a circuit configuration for employing the first electrical device with each of the plurality of terminals having a particular design that dictates a specific corresponding connection header be used for each of the designated combinations; and
   wherein the second electrical device is similar to the first electrical device, wherein the first parallel wiring harness comprises a first connection header configured to connect to one of the designated combinations to implement a particular circuit configuration.

2. The method of claim 1, wherein each terminal of the plurality of terminals comprises:
   a plurality of functional terminals; and
   a plurality of jumpered terminals.

3. The method of claim 2, wherein the plurality of jumpered terminals are independent of the plurality of functional terminals.

4. The method of claim 2, wherein the plurality of jumpered terminals and the plurality of functional terminals are internally connected within the first electrical device.

5. The method of claim 2, wherein at least one terminal of the plurality of terminals comprises a common terminal that is internally connected to at least one of the plurality of functional terminal.

6. The method of claim 1, wherein the first electrical device and the second electric device comprise a limit switch.

7. The method of claim 1, wherein the first electrical device and the second electric device comprise a pressure switch.

8. The method of claim 1, wherein the circuit configuration indicates that the first electrical device is connected to the second electrical device in series.

9. The method of claim 1, wherein the circuit configuration indicates that the first electrical device is connected to the second electrical device in parallel.

10. The method of claim 1, wherein the first parallel wiring harness comprises three cables connecting the controller to the first electrical device.

11. An electrical device comprising:
a contact;
a plurality of terminals coupled to the contact; and
wherein designated combinations of the plurality of terminals specify a circuit configuration for the electrical device with each of the plurality of terminals having a particular design that dictates a specific corresponding connection header be used for each of the designated combinations.

12. The electrical device of claim 11, wherein the contact is configured to indicate a status of the electrical device.

13. The electrical device of claim 11, wherein the electrical device comprises at least one of a limit switch and a pressure switch.

14. The electrical device of claim 11, wherein each terminal of the plurality of terminals comprises:
a plurality of functional terminals connected across the contact; and
a plurality of jumpered terminals.

15. The electrical device of claim 14, wherein the plurality of jumpered terminals are independent of the plurality of functional terminals.

16. The electrical device of claim 14, wherein the plurality of jumpered terminals and the plurality of functional terminals are internally connected within the electrical device.

17. The electrical device of claim 11, wherein the circuit configuration indicates that the electrical device is connected to another electrical device in series.

18. The electrical device of claim 11, wherein the circuit configuration indicates that the electrical device is connected to another electrical device in parallel.

19. The electrical device of claim 11, wherein the electrical device is operable within a Heating, Ventilating and Air Conditioning (HVAC) system.

20. A system comprising:
a controller;
a parallel wiring harness comprising a first connection header and a second connection header, wherein the first connection header is interoperably coupled to the controller;
a first electrical device comprising a plurality of terminals; and
wherein designated combinations of the plurality of terminals specify a circuit configuration for employing the first electrical device in the system with each of the plurality of terminals having a particular design that dictates a specific corresponding connection header be used for each of the designated combinations.

* * * * *